(12) United States Patent
Omura et al.

(10) Patent No.: US 6,819,703 B1
(45) Date of Patent: Nov. 16, 2004

(54) EXTERNAL CAVITY LASER

(75) Inventors: Hideyuki Omura, Chigasaki (JP); Hideyuki Nasu, Hiratsuka (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/281,710

(22) Filed: Mar. 30, 1999

(30) Foreign Application Priority Data

Apr. 3, 1998 (JP) .......................................... 10-092056

(51) Int. Cl.[7] .................................................. H01S 3/08
(52) U.S. Cl. .......................................... 372/108; 372/6
(58) Field of Search ................................. 372/6, 108, 9

(56) References Cited

U.S. PATENT DOCUMENTS

| | | | |
|---|---|---|---|
| 4,786,132 A | | 11/1988 | Gordon |
| 5,140,456 A | * | 8/1992 | Huber ........................... 372/6 |
| 5,200,964 A | * | 4/1993 | Huber ........................... 372/6 |
| 5,268,910 A | * | 12/1993 | Huber ........................... 372/6 |
| 5,337,375 A | * | 8/1994 | Nyman et al. ................. 372/6 |
| 5,699,377 A | | 12/1997 | Pan |
| 5,771,250 A | * | 6/1998 | Shigehara et al. ............. 372/6 |
| 5,892,781 A | * | 4/1999 | Pan et al. ...................... 372/6 |
| 5,910,962 A | * | 6/1999 | Pan et al. ...................... 372/6 |

OTHER PUBLICATIONS

First Optoelectronics and Communications Conference (OECC '96) Technical Digest, Jul. 1996, Makuhari Messe, pp. 456–457; sponsored by the Institute of Electronics Information and Communication Engineers; A. Hamakawa et al, "Characteristics of Modulation Distortion of Fiber-–Grating External–Cavity–Laser".

* cited by examiner

*Primary Examiner*—Don Wong
*Assistant Examiner*—Cornelius H. Jackson
(74) *Attorney, Agent, or Firm*—Oblon, Spivak, McClelland, Maier & Neustadt, P.C.

(57) ABSTRACT

In an external cavity laser, which comprises an FBG section having the Bragg wavelength of light reflected by a grating adjusted to a given wavelength and a laser light emitting device designed to generate light, optically coupled to the FBG section to ensure input and output of the light, and including a high-reflection surface for reflecting the generated light, the light is resonated by a cavity formed between the high-reflection surface and the grating, whereby a laser beam having a given oscillation wavelength is oscillated through a connector. The FBG section is located on an optical path between the laser light emitting device and the connector, and an isolator is located on an optical path between the FBG section and the connector. The isolator serves to absorb and intercept reflected waves or reflected return light from the connector.

14 Claims, 6 Drawing Sheets

EXTERNAL CAVITY LASER

BACKGROUND OF THE INVENTION

1. Field of the Invention

The present invention relates to an external cavity laser capable of oscillating a laser beam having a given oscillation wavelength by means of an optical fiber having the Bragg wavelength of light reflected by a grating adjusted to a given wavelength, i.e., a fiber Bragg grating (hereinafter referred to as "FBG").

2. Description of the Related Art

Conventionally, some lasers of this type, such as the one described in U.S. Pat. No. 4,786,132, oscillate a single-wavelength laser beam with the use of an FBG in an external cavity. One such laser appears in OECC '96 (First Optoelectronics and Communications Conference Technical Digest, July 1996, Makuhari Messe), 18P-18. This laser, using the FBG in its external cavity, has a so-called lensed-fiber arrangement such that an end facet of a fiber, which is an optical junction lensed.

According to this laser, the transmission quality of transmitted signals is evaluated by the signal-to-noise ratio characteristic. In the case of picture transmission, for example, the relative intensity of noise (RIN) is adjusted to −130 dB/Hz or less. Thereupon, the inventors hereof conducted an experiment in which signals were transmitted under the following conditions using an apparatus model that is constructed in the same manner as the prior art example described in OECC '96, as shown in FIG. 5.

This apparatus is a laser that has a strained multi quantum well structure, for example. The laser comprises a laser light emitting device 10 formed of a laser diode, for use as a light source, and an FBG section 20, which is a narrow-band reflector-type optical fiber functioning as an optical waveguide and having its reflection-peak wavelength adjusted to the Bragg wavelength. In this arrangement, the laser light emitting device 10 includes an active layer (not shown) and antireflection and high-reflection surfaces 11 and 12 formed on either side of the active layer. On the other hand, the FBG section 20 includes a lensed fiber having a first end facet 21 lensed in the shape of a hemispherical surface, a grating 22 formed in the fiber core, and a second end facet 23 that is equipped with a connector 30. In the laser constructed in this manner, light is generated in the active layer by injected current, and it is reflected by an external cavity, which is formed between the high reflection surface 12 and the grating 22, and is delivered as a laser beam from the second end facet 23 through the connector 30.

Parameters for the laser with this arrangement were set as follows. In the laser light emitting device 10, the field reflectance of the antireflection surface 11 was set at $10^{-4}$ or less, and the length from the antireflection surface 11 to the high-reflection surface 12 was adjusted to 600 $\mu$m or less. In the FBG section 20, the field reflectance and the full width at half maximum for the Bragg wavelength were set at 0.4 or less and 0.1 mm, respectively. The first end facet 21 was subjected to antireflection coating, its field reflectance was set at 0.4 or less, and the optical coupling efficiency was adjusted to 0.5.

FIG. 6 is a characteristic diagram showing a noise characteristic obtained from the experiment. Based on this result, the inventors hereof confirmed that the level of noise produced by connector connection, that is, the intensity level of reflected light that returns from the connector back to the laser, would inevitably influence the transmission band. Thereupon, the inventors hereof have measured the relative intensity noise (RIN) for the case where a physical connector (PC), superphysical connector (SPC), angled physical connector (APC) were connected individually to the second end facet 23 of the optical fiber. FIG. 7 is a diagram showing the results. For the case "NO ISOLATOR" shown in FIG. 7, RIN exceeded −130 dB/Hz irrespective of the connector type. Carrying out picture transmission in this state would result in lowered quality of picture transmission, with significant noise appearing on the screen.

SUMMARY OF THE INVENTION

The present invention has been contrived in consideration of these circumstances, and its object is to provide an external cavity laser capable of obtaining satisfactory transmission quality at all times irrespective of a connector or connectors to be connected.

In order to achieve the above object, in an external cavity laser according to the present invention, an FBG section is formed having the Bragg wavelength of light reflected by a grating adjusted to a given wavelength. A laser light emitting device having a reflective surface, which generates light, is optically coupled to the FBG section to ensure input and output of light. The generated light is reflected by the reflective surface. A cavity is formed including the reflective surface of the laser light emitting device and the grating. The cavity resonates the light between the reflective surface and the grating, thereby oscillating a laser beam having a given oscillation wavelength through the connector. Further, intercepting means, such as an isolator, is located on an optical path between the cavity and the connector, and intercepts reflected waves from the connector.

Thus, according to the invention, the isolator on the optical path between the cavity and the connector absorbs and intercepts the reflected waves or reflected return light from the connector. Accordingly, the noise characteristic is improved so that the noise level has no influence upon signals in the transmission band irrespective of the connector to be connected. In consequence, satisfactory transmission quality can be obtained at all times.

In the case where the FBG section of the external cavity laser is located on an optical path between the laser light emitting device and the connector, the isolator is located on an optical path between the FBG section and the connector so that the reflected waves from the connector can be absorbed and intercepted by means of the isolator to improve the noise characteristic.

In the case where the FBG section of the external cavity laser is located on an optical path situated on the opposite side of the laser light emitting device from the connector, the isolator is located on an optical path between the laser light emitting device and the connector so that the reflected waves form the connector can be absorbed and intercepted by means of the isolator to improve the noise characteristic.

DESCRIPTION OF THE PREFERRED EMBODIMENTS

External cavity lasers according to the present invention will now be described with reference to the accompanying drawings of FIGS. 1 to 4.

Figure 1:
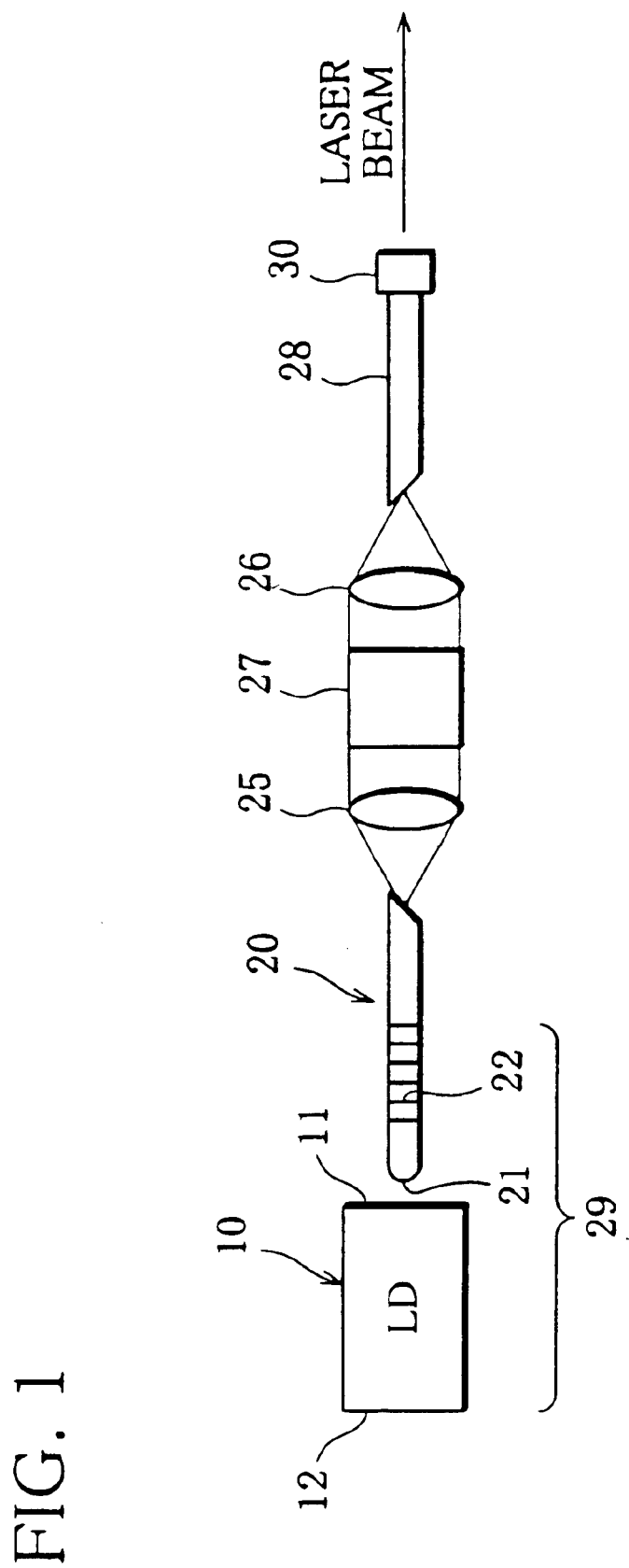
FIG. 1 shows a schematic configuration of an external cavity laser according to a first embodiment of the present invention.

FIG. 1 shows a schematic configuration of an external cavity laser according to a first embodiment of the invention. In the description to follow, like portions are designated by like reference numerals for simplicity of illustration.

Figure 5:
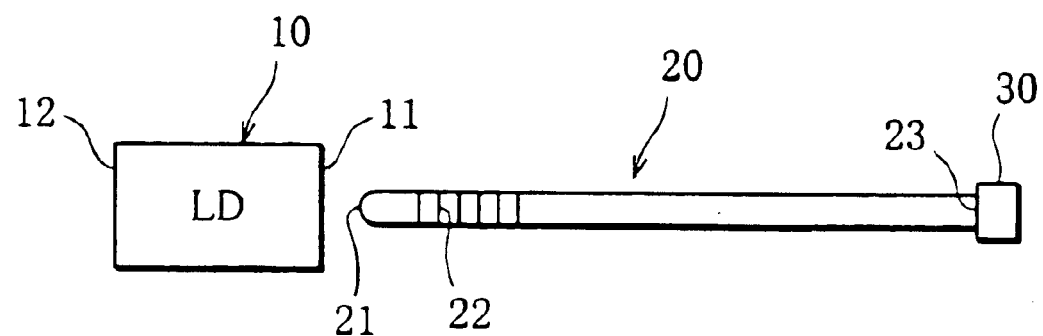
FIG. 5 shows a schematic configuration of a conventional external cavity laser.
Figure 6:
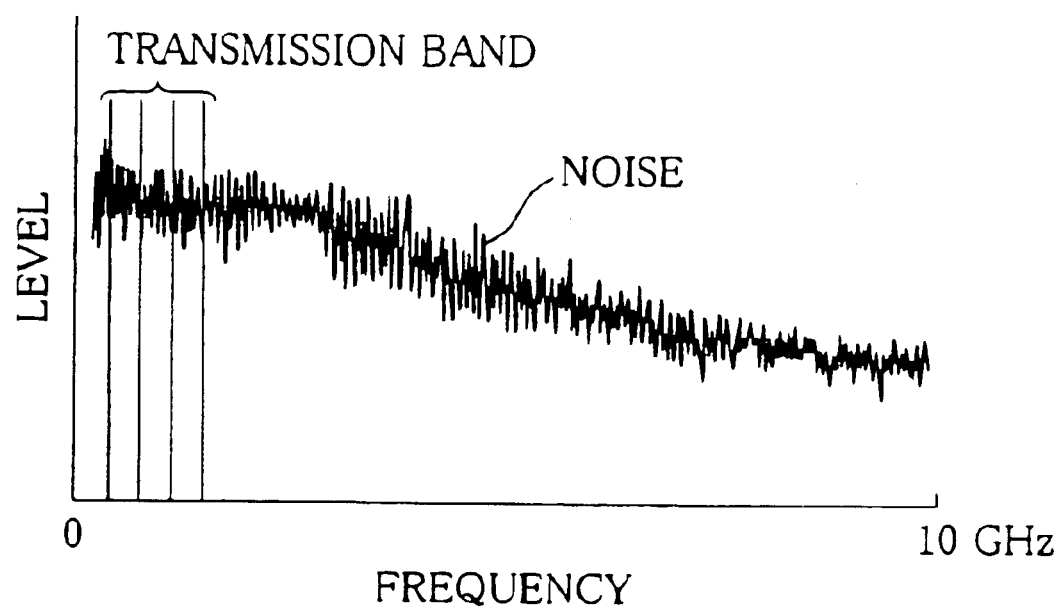
FIG. 6 is a characteristic diagram showing the noise characteristic of the laser shown in FIG. 5.

Referring now to FIG. 1, there is shown the external cavity laser according to the first embodiment, which, like the one shown in FIG. 5, is formed of a strained multi quantum well laser, for example. The external cavity laser comprises a laser light emitting device 10, which has an antireflection surface 11 and a high-reflection surface 12, and an FBG section 20, which has a lensed end facet 21 and a grating 22. Further, the external cavity laser includes optical lenses 25 and 26, an isolator 27 for use as intercepting means according to the invention, located between the lenses 25 and 26, and an optical fiber 28 having one end equipped with a connector 30, as well as the laser light emitting device 10 and the grating 22. A cavity 29 is formed between the high-reflection surface 12 of the device 10 and the grating 22. These components are arranged on the optical path of the FBG section 20. A light beam emitted from the device 10 is reflected and amplified by the cavity 29, and is outputted as a laser beam with a given wavelength defined by the Bragg wavelength through the isolator 27, optical fiber 28, and connector 30.

Even if a low-reflection APC, for example, is used as the connector 30 in an external cavity laser such as the conventional one, return light is reflected from the connector 30 toward the laser, whereby the transmission band is influenced inevitably. In this embodiment, therefore, the isolator 27 is interposed between the FBG section 20 and the optical fiber 28 so that the reflected return light is absorbed lest reflected waves return to the cavity 29.

The external cavity laser constructed in this manner was used to obtain a noise characteristic for the transmission band with use of the field reflectance of the optical lenses 25 and 26 at $10^{-4}$ or less and the isolation level of the isolator 27 at 60 dB, besides the parameters set with reference to FIG. 5.

Figure 2:
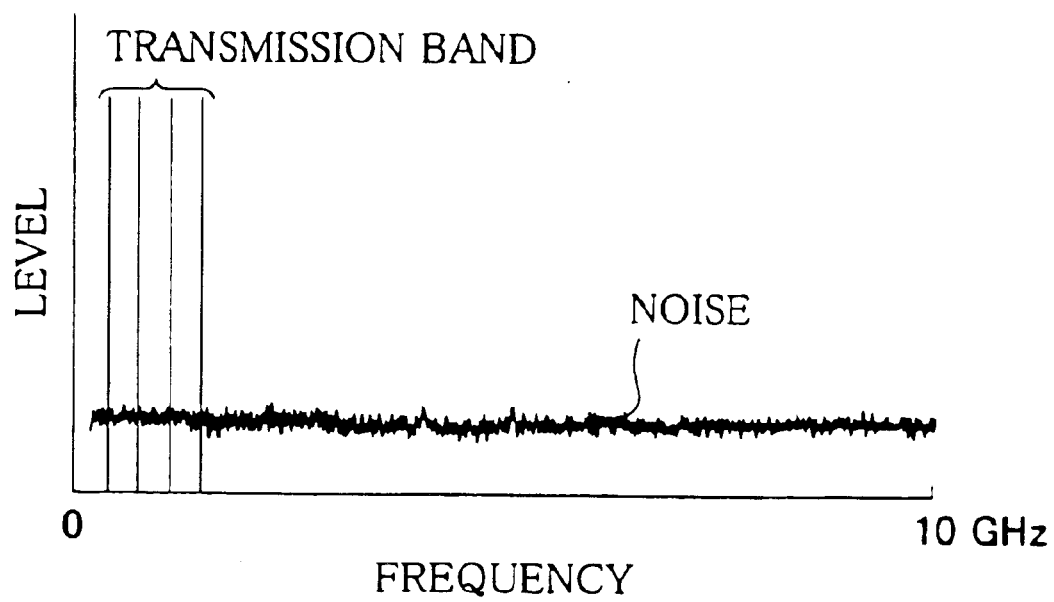
FIG. 2 is a characteristic diagram showing the noise characteristic of the laser shown in FIG. 1.
Figure 7:
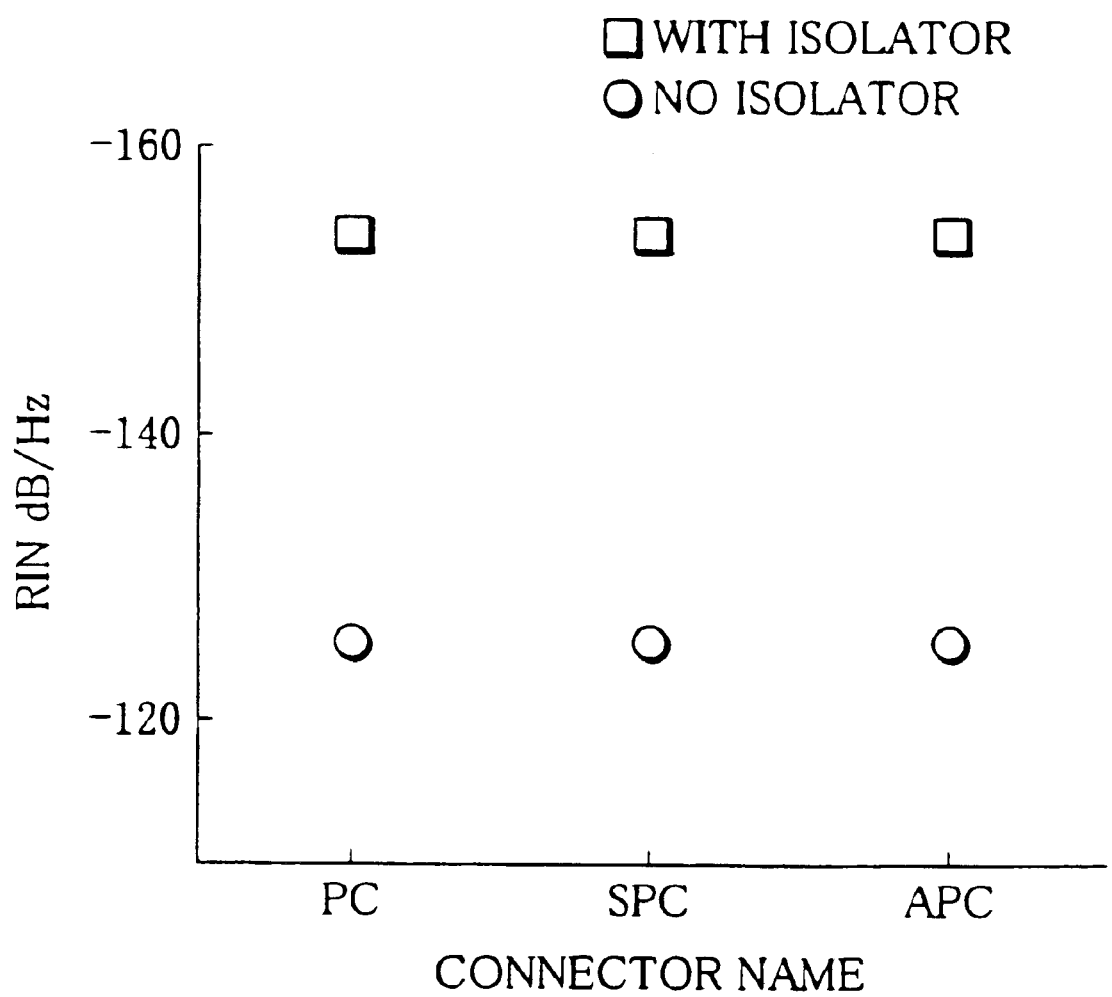
FIG. 7 is a diagram showing the relation between the connector type and relative intensity of noise (RIN).

FIG. 2 is a characteristic diagram showing the noise characteristic of the external cavity laser. As seen from FIG. 2, noises were lowered to a level such that they never influence signals in the transmission band. PC, SPC, and APC were used for the connector 30. In any case, the relative intensity noise was lower than −150 dB/Hz, as shown in the diagram of FIG. 7 (see "WITH ISOLATOR"), so that the transmission quality was able to be improved.

Thus, according to this embodiment, the reflected waves from the connector are intercepted by the isolator that is located behind the FBG section. Consequently, the noise level has no influence upon the signals in the transmission band irrespective of the type of the connector to be connected, so that satisfactory transmission quality can be obtained at all times. Even in picture transmission, therefore, good picture transmission quality can be maintained, and the screen can be prevented from suffering noises.

The parameters according to this embodiment are set only to conduct the aforementioned experiment, and the external cavity laser with the isolator according to the invention can be used with alternative set values. Even in the case where the isolation level of the isolator 27 is set at 60 dB or less, for example, the relative intensity noise can be improved, although the transmission quality is lowered in some measure. Thus, the external cavity laser of the invention can be satisfactorily applied to signal transmission in which the relative intensity noise is not a very important factor. Further, the relative intensity noise can be improved without restricting the invention to those alternative set parameter values.

Figure 3:
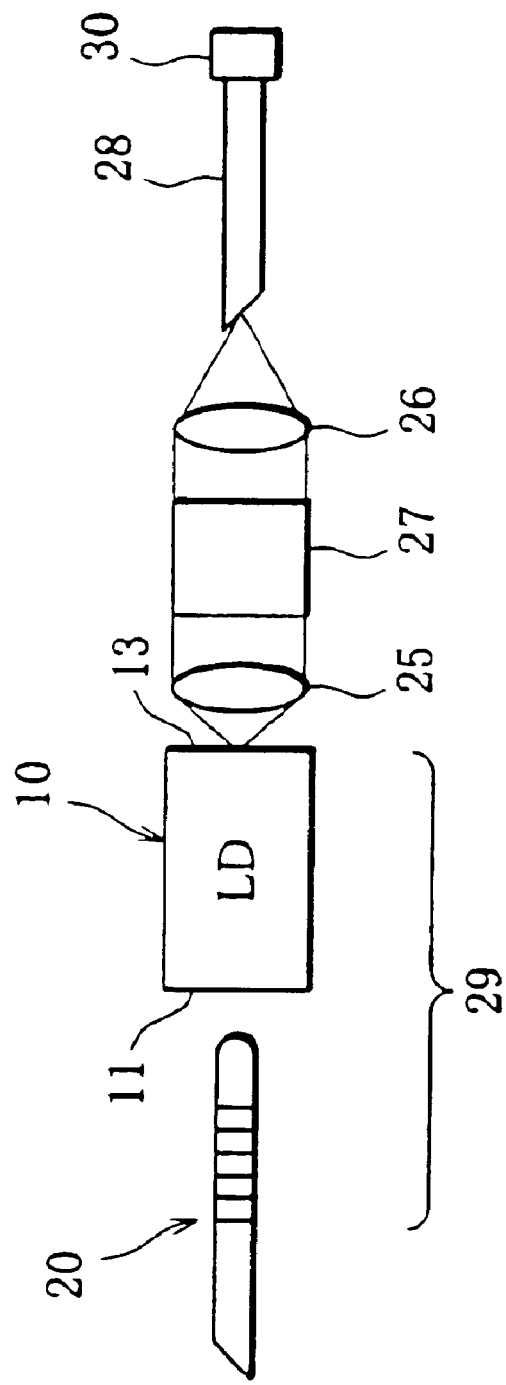
FIG. 3 shows a schematic configuration of an external cavity laser according to a second embodiment of the invention.

FIG. 3 shows a schematic configuration of an external cavity laser according to a second embodiment of the invention. As shown in FIG. 3, the second embodiment differs from the first embodiment of FIG. 1 in that an FBG section 20 having a lensed end facet 21 and a grating 22 is located on the rear face side (side of an antireflection surface 11) a laser light emitting device 10 and that a cavity 29 is formed between a low-reflection surface 13 of the device 10 and the grating 22. Another difference lies in that optical lenses 25 and 26 and an isolator 27 that are similar to the ones according to the first embodiment are located behind the low-reflection surface 13 of the device 10.

According to the this embodiment, a light beam emitted from the laser light emitting device 10 is reflected and amplified by the cavity 29, and is outputted as a laser beam with a given wavelength defined by the Bragg wavelength through the low-reflection surface 13, the isolator 27, an optical fiber 28, and a connector 30. Further, reflected waves from the connector 30 are intercepted by the isolator 27.

Thus, according to this embodiment, the reflected waves from the connector are intercepted by the isolator that is located behind the laser light emitting device. As in the case of the first embodiment, therefore, satisfactory transmission quality can always be obtained irrespective of the type of the connector to be connected.

Figure 4:
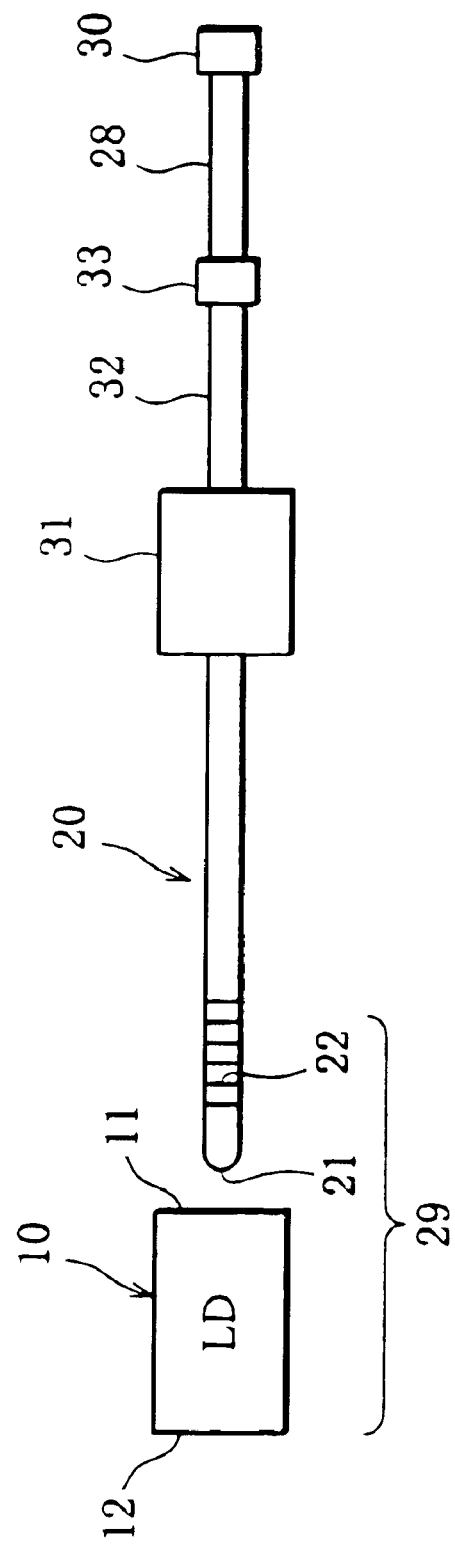
FIG. 4 shows a schematic configuration of an external cavity laser according to a third embodiment of the invention.

FIG. 4 shows a schematic configuration of an external cavity laser according to a third embodiment of the invention. As shown in FIG. 4, the third embodiment is constructed in the same manner as the first embodiment except that a unit 31 composed of the optical lenses 25 and 26 and the isolator 27 according to the first embodiment is connected to an FBG section 20. Further, the unit 31 is connected to an optical fiber 28 through an optical fiber 32 and a connector 33 in order to extend the optical waveguide.

According to the this embodiment, a light beam emitted from a laser light emitting device 10 is reflected and amplified by a cavity 29 that is formed between a high-reflection surface 12 and a grating 22, and is outputted as a laser beam with a given wavelength defined by the Bragg wavelength through the FBG section 20, unit 31, optical fibers 32 and 28, and connectors 33 and 30. Reflected return beams that return from the connectors 30 and 33 toward the laser are intercepted by the isolator 27 in the unit 31.

Thus, according to this embodiment, the reflected waves from a plurality of connectors can be intercepted by means of the isolator although the light guide is extended with use of the connectors. Consequently, the noise level has no influence upon the signals in the transmission band irrespective of the number of connectors to be connected, so that satisfactory transmission quality can be obtained at all times.

The present invention is not limited to the embodiments described above. Even in the case where the light guide is extended with use of three or more connectors, reflected waves from the connectors can be intercepted by means of an isolator in the same manner as aforesaid.

Thus, according to embodiments described above, the reflected waves from the connector(s) are intercepted by means of the isolator that is located behind the external cavity formed between the laser light emitting device and the grating. Accordingly, satisfactory transmission quality can always be obtained irrespective of the type or number of connector(s) to be connected.

Although the isolator is used as the reflected wave intercepting means according to the above-described embodiments, moreover, the present invention is not limited to those embodiments, and a circulator or the like may be used as the intercepting means.

As described herein, the external cavity laser of the invention comprises a fiber Bragg grating section formed of an optical fiber having the Bragg wavelength of light reflected by a grating adjusted to a given wavelength, a laser light emitting device designed to generate light, optically coupled to the fiber Bragg grating section to ensure input and output of the light, and including a reflective surface for reflecting the generated light, a cavity formed including the laser light emitting device and the grating and designed to resonate the light between the reflective surface of the last light emitting device and the grating, thereby oscillating a laser beam having a given oscillation wavelength through a connector. Further, the external cavity laser comprises intercepting means located on an optical path between the cavity and the connector. The intercepting means serves to intercept reflected waves from the connector directed to the laser light emitting device. Thus, according to the present invention, the noise level has no influence upon the signals in the transmission band irrespective of the connector(s) to be connected, so that satisfactory transmission quality can be obtained at all times.

What is claimed is:

1. An external cavity laser for oscillating laser light through a connector, comprising:
    a fiber Bragg grating section formed of an optical fiber having a Bragg wavelength of light reflected by a grating adjusted to a given wavelength;
    a laser light emitting device that generates light, and that is optically coupled to the fiber Bragg grating section to ensure input and output of the light, said laser light emitting device including a reflective surface for reflecting the generated light;
    a cavity that is formed by the laser light emitting device and the grating, and that resonates the light between the reflective surface of the laser light emitting device and the grating, thereby oscillating a laser beam having a given oscillation wavelength;
    a connector that outputs the light oscillated by the cavity, said connector being a first connector provided on an optical path extending from the laser light emitting device, and
    intercepting means for intercepting waves reflected from the connector so that the external cavity laser maintains a relative intensity noise (RIN) less than −130 dB/Hz in a transmission band having frequencies equal to or less than 10 GHz;
    wherein the fiber Bragg grating section is located on the optical path between the laser light emitting device and the connector; and
    wherein the intercepting means is located on the optical path between the fiber Bragg grating section and the connector.

2. The external cavity laser according to claim 1, wherein the intercepting means comprises an isolator.

3. The external cavity laser according to claim 1, wherein the intercepting means comprises a circulator.

4. The external cavity laser according to claim 1, wherein the connector comprises a physical connector.

5. The external cavity laser according to claim 1, wherein the connector comprises a superphysical connector.

6. The external cavity laser according to claim 1, wherein the connector comprises an angled physical connector.

7. The external cavity laser according to claim 1, wherein a relative intensity of noise (RIN) less than −150 dB/Hz is maintained in a transmission band having frequencies equal to or less than 10 GHz.

8. An external cavity laser for oscillating laser light through a connector, comprising:
    a fiber Bragg grating section formed of an optical fiber having a Bragg wavelength of light reflected by a grating adjusted to a given wavelength;
    a laser light emitting device that generates light, and that is optically coupled to the fiber Bragg grating section to ensure input and output of the light, said laser light emitting device including a reflective surface for reflecting the generated light;
    a cavity that is formed by the laser light emitting device and the grating, and that resonates the light between the reflective surface of the laser light emitting device and the grating, thereby oscillating a laser beam having a given oscillation wavelength;
    a connector that outputs the light oscillated by the cavity, said connector being a first connector provided on an optical path extending from the laser light emitting device; and
    an intercepting element configured to intercept waves reflected by the connector so that the external cavity laser maintains a relative intensity noise (RIN) less than −130 dB/Hz in a transmission band having frequencies equal to or less than 10 GHz;
    wherein the fiber Bragg grating section is located on the optical path between the laser light emitting device and the connector; and
    wherein the intercepting element is located on the optical path between the fiber Bragg grating section and the connector.

9. The external cavity laser according to claim 8, wherein the intercepting element comprises an isolator.

10. The external cavity laser according to claim 8, wherein the intercepting element comprises a circulator.

11. The external cavity laser according to claim 8, wherein the connector comprises a physical connector.

12. The external cavity laser according to claim 8, wherein the connector comprises a superphysical connector.

13. The external cavity laser according to claim 8, wherein the connector comprises an angled physical connector.

14. The external cavity laser according to claim 8, wherein a relative intensity of noise (RIN) less than −150 dB/Hz is maintained in a transmission band having frequencies equal to or less than 10 GHz.

* * * * *